(12) United States Patent
Tao et al.

(10) Patent No.: US 8,191,433 B2
(45) Date of Patent: Jun. 5, 2012

(54) METHOD FOR MANUFACTURING FABRIC STRAIN SENSORS

(75) Inventors: XiaoMing Tao, Hong Kong (HK); GuangFeng Wang, Hong Kong (CN); YangYong Wang, Hong Kong (CN); Hui Zhang, Hong Kong (CN)

(73) Assignee: The Hong Kong Polytechnic University, Kowloon (HK)

( * ) Notice: Subject to any disclaimer, the term of this patent is extended or adjusted under 35 U.S.C. 154(b) by 302 days.

(21) Appl. No.: 12/122,883

(22) Filed: May 19, 2008

(65) Prior Publication Data

US 2009/0282671 A1 Nov. 19, 2009

(51) Int. Cl.
*G01L 1/22* (2006.01)
*G01L 1/26* (2006.01)
*G01L 1/00* (2006.01)

(52) U.S. Cl. ... 73/862.474; 73/763; 73/774; 73/862.391

(58) Field of Classification Search .......... 442/110–117; 73/763, 862.474, 774, 775, 818, 826, 862.391, 73/862.381, 862.471
See application file for complete search history.

(56) References Cited

U.S. PATENT DOCUMENTS

| | | | |
|---|---|---|---|
| 4,567,093 A | 1/1986 | Sogabe et al. | |
| 4,705,646 A | 11/1987 | DuPont et al. | |
| 4,715,235 A * | 12/1987 | Fukui et al. | 73/862.68 |
| 5,009,927 A | 4/1991 | Cloyd et al. | |
| 5,447,661 A | 9/1995 | Takahashi et al. | |
| 5,449,714 A | 9/1995 | Inoue et al. | |
| 6,360,615 B1 * | 3/2002 | Smela | 73/862.474 |
| 6,543,299 B2 * | 4/2003 | Taylor | 73/862.046 |
| 6,660,978 B1 | 12/2003 | Avdeev et al. | |
| 7,301,435 B2 * | 11/2007 | Lussey et al. | 338/13 |
| 7,320,947 B2 * | 1/2008 | Child et al. | 442/110 |
| 7,531,203 B2 * | 5/2009 | Tao et al. | 427/58 |
| 2002/0194934 A1 * | 12/2002 | Taylor | 73/862.046 |
| 2004/0053552 A1 * | 3/2004 | Child et al. | 442/110 |
| 2005/0100692 A1 | 5/2005 | Parker | |
| 2005/0282453 A1 | 12/2005 | Jackson et al. | |
| 2006/0148351 A1 | 7/2006 | Tao et al. | |
| 2006/0258247 A1 * | 11/2006 | Tao et al. | 442/301 |
| 2006/0286390 A1 | 12/2006 | Yaginuma et al. | |
| 2007/0065586 A1 * | 3/2007 | Tao et al. | 427/299 |
| 2011/0039064 A1 * | 2/2011 | Wani et al. | 428/137 |

OTHER PUBLICATIONS

Lorussi, et al., "Wearable, Redundant Fabric-Based Sensor Arrays for Reconstruction of Body Segment Posture", IEEE. Sensors Journal, Dec. 2004, vol. 4, No. 6, pp. 807-818.
Scilingo et al., "Strain-Sensing Fabrics for Wearable Kinaesthetic-Like Systems", IEEE Sensors Journal, Aug. 2003, vol. 3, No. 4, pp. 460-467.
De Rossi et al., "Dressware: wearable hardware", Materials Science and Engineering, 1999, pp. 31-35.
Cheng et al., "Polypyrrole-coated Fabric Strain Sensor with High Sensitivity and Good Stability", IEEE International Conference on Nano/Micro Engineered and Molecular Systems, 2006, pp. 1245-1249, Jan. 2006.

(Continued)

*Primary Examiner* — Lisa Caputo
*Assistant Examiner* — Jonathan Dunlap
(74) *Attorney, Agent, or Firm* — Kauth, Pomeroy, Peck & Bailey LLP

(57) ABSTRACT

A fabric strain sensor (10) for measuring in-plane unidirectional strain, the sensor (10) comprising a mixture (20) of electrically conductive particles or fibers and an elastomer matrix, applied onto an elastic fabric substrate (30).

13 Claims, 5 Drawing Sheets

OTHER PUBLICATIONS

Mazzoldi et al., "Smart Textiles for Wearable Motion Capture Systems", AUTEX Research Journal, Dec. 2002, vol. 2, No. 4, pp. 199-203.

Patra et al., "Quantum Tunneling Nanocomposite Textile Soft Structure Sensor and Actuators", NTC Annual Report, Nov. 2004, 6 pages.

* cited by examiner

Figure 1a Knitted fabric (wale direction)   Figure 1b Knitted fabric (course direction)

Woven structure (PRIOR ART)

Braid structure (PRIOR ART)

Figure 5 (a) Resistance versus time of the fabric strain sensors cyclic test (maximum strain is 20%) in the wale direction (with a gauge factor of 3)

(PRIOR ART)

Figure 5 (b) Resistance versus time of the fabric strain sensors cyclic test (maximum strain is 20%) in the course direction (with a gauge factor of 200)

(PRIOR ART)

METHOD FOR MANUFACTURING FABRIC STRAIN SENSORS

TECHNICAL FIELD

The invention concerns a method for manufacturing fabric strain sensors with a high gauge factor.

BACKGROUND OF THE INVENTION

Devices for measuring the dimensional changes of an object due to the mechanical or thermal stress or a combination of both are typically referred to as strain gauges or strain sensors. Strain sensors have various types such as: optical fiber strain sensors, piezoelectric ceramic strain sensors and electromechanical strain sensors. The electromechanical strain sensors are fabricated by conductive polymers or polymer composites with conductive fillings.

US application 20060148351 (Tao; Xiaoming; et al. J; and De Rossi et al. in "Materials Science Engineering, C", 7(1), 31-35 (1998), "Dressware: Wearable Hardware" and "IEEE Sensors Journal 2003", 460-467, "Strain-sensing fabrics for wearable kinaesthetic-like systems", introduced strain sensors made of conductive polymer coated fabric. However, due to the conductive polymer used, the environmental and chemical stability of the sensor is a problem in long term applications.

De Rossi et al. in "Autex Research Journal 2002", 2(4): 193-203, "Smart textiles for wearable motion capture system", and in "IEEE Sensors Journal 2004", 807-818, "Wearable, redundant fabric-based sensor arrays for reconstruction of body segment posture", reported strain sensors to measure body segments made of carbon loaded silicon rubber coated fabrics. However, the sensors exhibited a low gauge factor of 2.5. The higher gauge factor is proffered for strain sensors. The fatigue test of the strain sensors was not addressed in these reports.

In "MateriaLs Science Forum 2007", 537-538 and 709-716; and "High elastic strain gauge made from conductive silicon rubber", Laszlo et al, introduced methods to fabricate large strain gauge from conductive silicon rubber. The structure of the 35 sensor is a pure polymer and not fabric and the sensor exhibits Low sensitivity.

In U.S. Pat. No. 4,567,093 (Sogabe, et al.), US application 20050282453 (Jackson, Scott Richard, et al.) and US application 20060286390 (Yaginuma; Atsushi, et al.), methods and applications of the coated fabrics as airbags and protected fabrics are disclosed. But no sensors are disclosed in the US patent or applications.

In U.S. Pat. No. 6,660,978 (Avdeev, U.S. Pat. No. 4,705, 646 (DuPont et al. and U.S. Pat. No. 5,009,927 (Cloyd et al.), conductive particles were added into the coated polymer to render the fabric electrical conductivity properties. These properties have suggested it is used in the control of static charges, heating, electrical conducting, and electromagnetic wave shielding. However, no sensors are disclosed in these US patents.

Using electrically conductive elastomer composites coated on elastic fabric as strain/pressure sensors can be limited. Examples of limitations of using electrically conductive elastomer composites for sensors that can be encountered, which are not coated on fabric, include sensors which exhibit low sensitivity and linearity. In addition, electrically conductive elastomer composites coated on fabric are typically not used in sensor applications. Therefore electrically conductive elastomer composites suitable for use as flexible strain/pressure fabric sensors and a method for manufacturing the same is highly desirable.

SUMMARY OF THE INVENTION

In a first preferred aspect, there is provided a fabric strain sensor for measuring in-plane unidirectional strain, the sensor including a mixture of electrically conductive particles or fibers and an elastomer matrix, applied onto an elastic fabric substrate.

The sensor may have a maximum strain of 50%, a strain sensitivity (gauge factor having a range from 2 to 500 and a fatigue life of at least 100,000 cycles.

In a second aspect, there is provided a method for manufacturing a fabric strain sensor, the method including applying a mixture of electrically conductive particles or fibers and an elastomer matrix onto an elastic fabric substrate. The method may further include cleaning the elastic fabric substrate; and drying the elastic fabric substrate.

The method may also include curing the electrically conductive particles or fibers to remove water or other solvent present in the electrically conductive particles or fibers.

The method may further include treating the electrically conductive particles with coupling agents to enhance the adherence of the electrically conductive particles or fibers to the elastomer matrix.

The method may further include mechanically uniformly mixing the electrically conductive particles or fibers and the elastomer matrix together.

The method may further include curing the coated elastic fabric substrate at an elevated temperature.

The method may further include stretching the coated elastic fabric substrate in multiple cycles at high levels of extension and at a controlled temperature.

The fabric strain sensor may be used to sense in-plane deformation.

The elastic fabric substrate may have a woven, non-woven, knitted or a braid structure.

The electrically conductive particles may be anyone from the group of carbon black, gold particles, silver particles, copper particles, carbon nanotubes, stainless steel fiber, gold fiber, silver fiber, gold fiber, copper fiber, carbon fiber and conductive polymer fiber.

The elastomer matrix may be made from anyone from the group of natural rubber, silicon rubber, polyurethane, polysulfide, polyacrylic, fluorosilicone and any other elastic matrix.

The volume fraction of the electrically conductive particles in the mixture is predetermined.

The applying may be performed by anyone from the group of screen printing, lamination, binder coating, fusible coating, foam coating, padding and extrusion

BRIEF DESCRIPTION OF THE DRAWINGS

An example of the invention will now be described with reference to the accompanying drawings, in which.

DETAILED DESCRIPTION OF THE DRAWINGS

Figure 1:
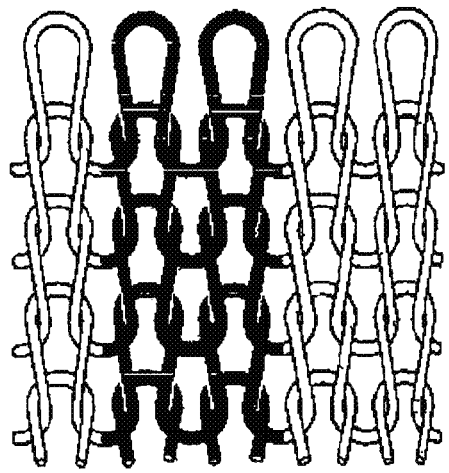
FIG. 1 is a knitted structure of an elastic fabric substrate for a fabric strain sensor in wale and course directions in accordance with an embodiment of the present invention.
Figure 1:
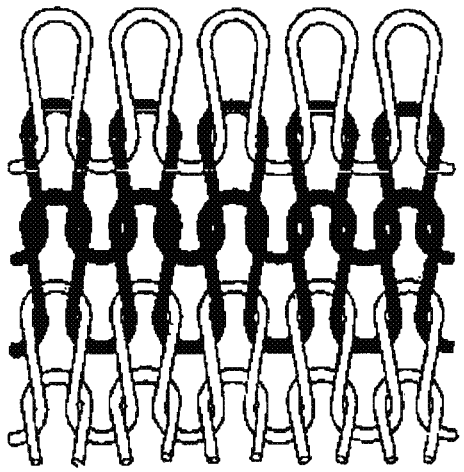

Referring to the drawings, a fabric strain sensor 10 and a method for manufacturing the fabric strain sensor 10 is provided. The sensor 10 measures in-plane unidirectional strain. The sensor 10 generally includes a mixture 20 of electrically conductive particles or fibers and an elastomer matrix. The mixture 20 is applied onto an elastic fabric substrate 30. The sensing technique of the sensor 10 is based on detecting a resistance change of the electrically conductive particles or fibers loaded elastomer matrix when the elastic fabric substrate 30 that is coated on the sensor 10 is stretched, pressured, twisted or heated.

Figure 7:
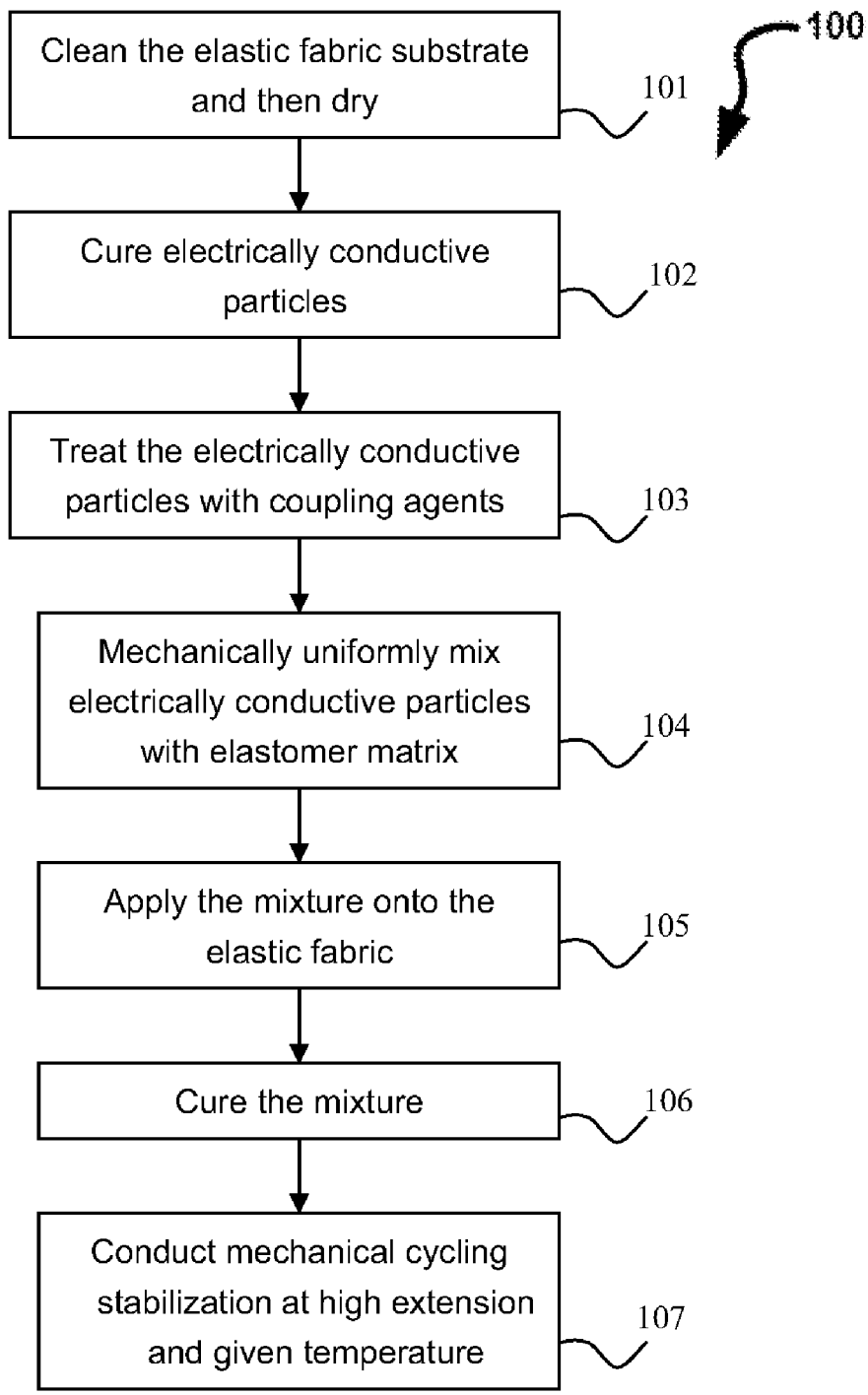
FIG. 7 is a process flow diagram of a method for manufacturing a fabric strain sensor in accordance with an embodiment of the present invention.

Turning to FIG. 7, the elastic fabric substrate 30 is cleaned 101 with a non-ionic detergent and then dried. The elastic fabric substrate 30 is cleaned 101 so that it improves the adherence between the elastic fabric substrate 30 and a mixture 20 of electrically conductive particles or fibers and an elastomer matrix. The electrically conductive particles or fibers are cured 102 by heating to remove any water or other solvent present in the electrically conductive particles. The conductive particles or fibers are treated with coupling agents 103 to enhance the adherence with the elastomer matrix. The electrically conductive particles or fibers and the elastomer matrix are initially mechanically uniformly mixed 104 to form the mixture 20 by a three roll grinding machine. The mixture 20 is coated 105 on the elastic fabric substrate 30 by screen printing, lamination, binder coating, fusible coating, foam coating, padding and extrusion. The coated elastic fabric substrate 30 is cured 106. A post-treatment procedure 107 is performed on the coated elastic fabric substrate 30 by mechanically stretching the coated elastic fabric substrate 30 In multiple cycles at high extensions to stabilize the fabric strain sensors. The coated elastic fabric substrate 30 may be used as the strain sensor 10.

Figure 2:
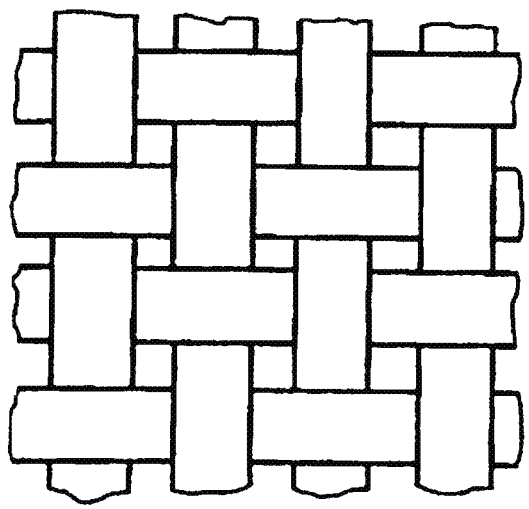
FIG. 2 is a woven structure of an elastic fabric substrate for a fabric strain sensor in accordance with an embodiment of the present invention.
Figure 3:
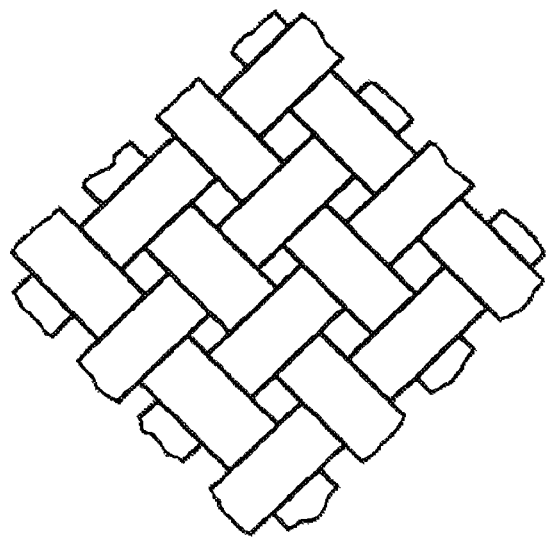
FIG. 3 is a braid structure of an elastic fabric substrate for a fabric strain sensor in accordance with an embodiment of the present invention.

Referring to FIGS. 1 to 3, in one embodiment, the elastic fabric substrate 30 has a knitted, woven, non-woven, or a braid structure. Higher elasticity recovery is required for the elastic fabric substrate 30. It is preferable for the fabric to recover to the original form after undergoing large, repeated deformation so therefore the knitted structure with elastic yarn is preferred. The knitted fabric shown in FIG. 1 has different structures in wale direction (FIG. 1a) and course direction (FIG. 1b), which can result in anisotropic properties in different directions of the sensor 10.

The electrically conductive particles or fibers may be: carbon black, gold particles, silver particles, copper particles, carbon nanotubes, stainless steel fiber, gold fiber, silver fiber, gold fiber, copper fiber, carbon fiber and conductive polymer fiber. The elastomer matrix may be made from: natural rubber, silicon rubber, polyurethane, polysulfide, polyacrylic, fluorosilicone and any other elastic matrix. The sensitivity, repeatability, linearity, gauge range may be adjusted by using the above mentioned sensing techniques individually or in combination according to particular usage. The initial resistance may be changed by varying the volume fraction of the electrically conductive particles or fibers, thickness of the elastomer matrix, constituents of the elastomer matrix, fabric specification and fabric structure.

Figure 4:
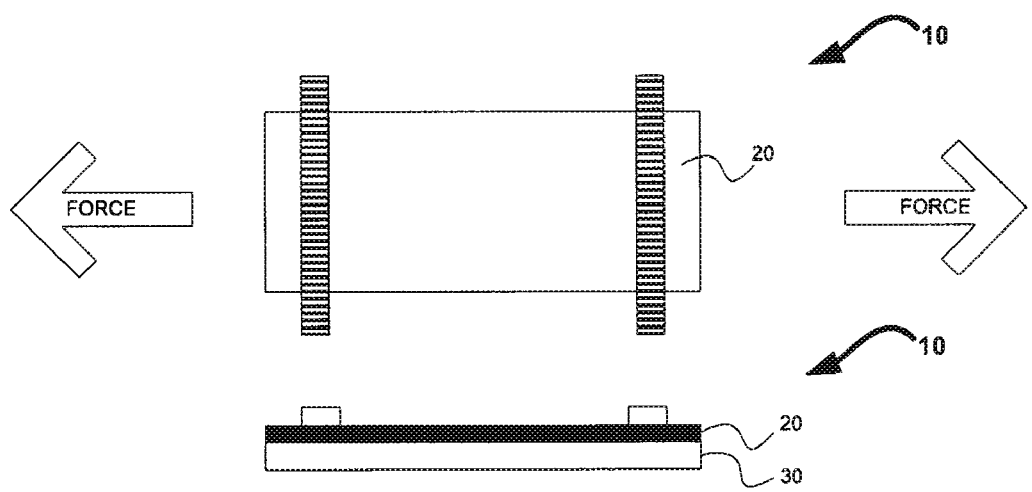
FIG. 4 is a top view and cross-sectional view of a fabric sensor in accordance with an embodiment of the present invention.

Referring to FIG. 4, in one embodiment, the mixture 20 of electrically conductive particles or fibers (carbon black) and the elastomer matrix (rubber) is coated onto an elastic fabric substrate 30 to produce the sensor 10. A knitted elastic fabric is used for the elastic fabric substrate 30, although elastic woven, non-woven, or braid may be used instead. The elastic fabric substrate 30 is first cleaned with a non-ionic detergent 101 and then dried. The carbon black is pre-treated by curing 102 to remove any water present or other solvent. Next, the carbon black is pretreated with coupling agents 103 to enhance the adherence with the rubber.

Carbon black with a weight concentration of 10% was added to the rubber. The carbon black and the rubber are mechanically uniformly mixed 104 to form the mixture 20 by a three roll grinding machine. The mixture 20 is coated on the elastic fabric substrate 30 by screen printing method 105. Next, the coated elastic fabric substrate 30 is cured 106. The coated elastic fabric substrate 30 is mechanically treated 107 by cycling at high extensions to stabilize the sensor 10.

The initial resistance of the elastic fabric substrate 30 coated with the mixture 20 of carbon black and the rubber is in an order of several thousand ohms with a diameter of 2.54 cm×2.54 cm, which may be reduced by increasing the concentration of the carbon black in the mixture 20.

Figure 5:
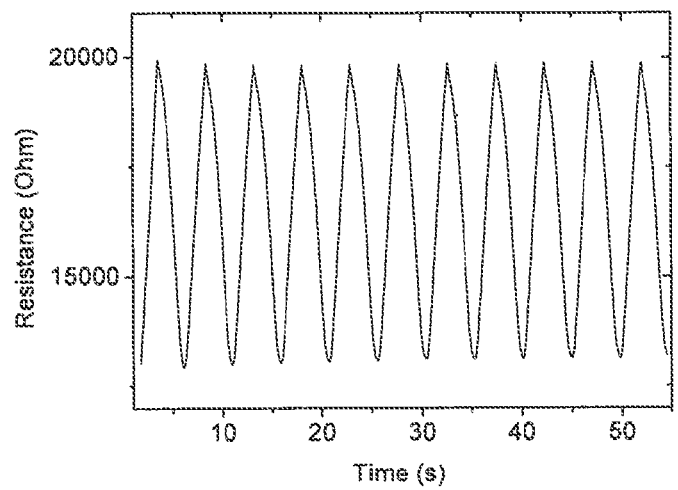
FIG. 5 is a chart showing the resistance versus time of a fabric strain sensor in accordance with an embodiment of the present invention.
Figure 5:
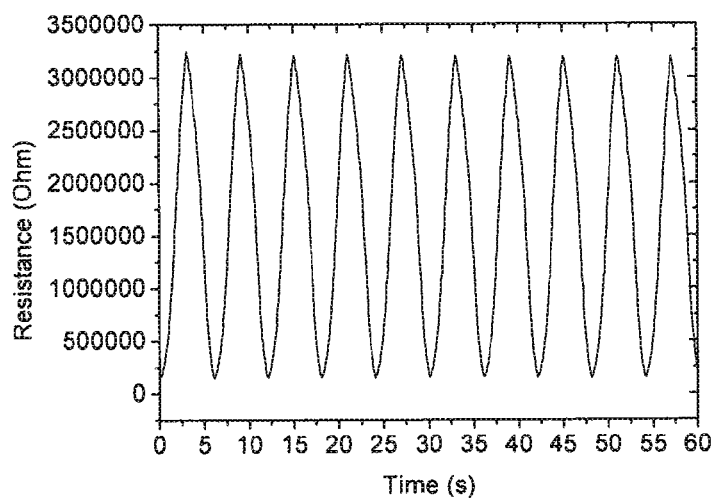
Figure 6:
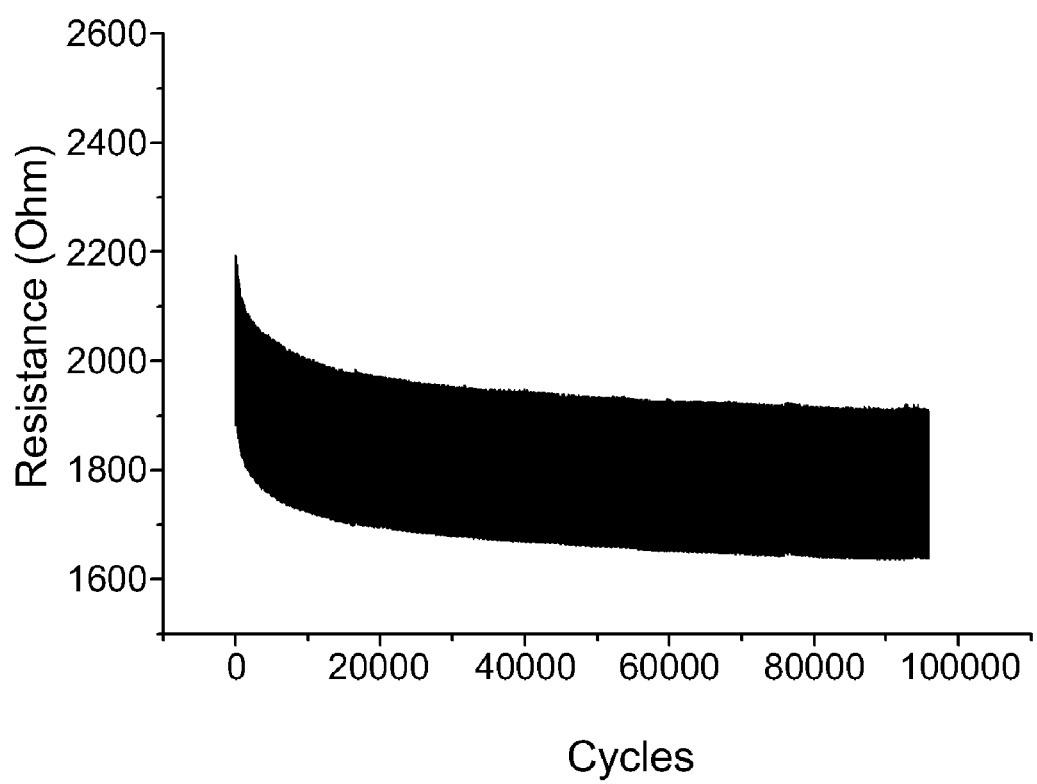
FIG. 6 is a chart showing the results of a fatigue test of a fabric strain sensor in accordance with an embodiment of the present invention.

When a strain is applied on the sensor 10, the extension of the mixture 20 coated on the elastic fabric substrate 30 causes cracks on the surface of the elastic fabric substrate 30. The resistance change caused by the cracks on the surface of the elastic fabric substrate 30 is used to measure the strain or the pressure applied on the sensor 10. The resistance versus time of the sensor 10 under cycling load is shown in FIG. 5. A gauge factor of 3 in wale direction and 200 in course direction is achieved by the sensor 10. The gauge factor may be controlled by adjusting the concentration of the conductive fillings, thickness of the coating and direction of the sensor. The anisotropic gauge factor of the strain sensor 10 in different direction varies from 2 to 500, which is decided by the weaving structure of the elastic fabric substrate 30. The sensor 10 has very high performance which can pass over 100,000 cyclic fatigue test as shown in FIG. 6.

Advantageously, the material used for the sensor 10 is low cost and the fabrication is applied using existing coating equipment. The sensor 10 provides a wide range of gauge factor from 2 to 500 (the most sensitive fabric strain sensor) and initial resistance from 1K to 1000K based on the mixture 20 and coated methods. The sensor 10 has desirable anti-fatigue characteristics (100,000 cycles extension-recovery with maximum strain 50%), and the maximum initial resistance change is less than 10%. The on-shelf resistance change for one month is less than 2%. The sensor 10 has desirable stability in dry and wet conditions and is able to resist alkaline and acidic environments. The material for the sensor 10 is non-toxic to humans and the fabrication process is environmentally friendly.

It will be appreciated by persons skilled in the art that numerous variations and/or modifications may be made to the invention as shown in the specific embodiments without departing from the scope or spirit of the invention as broadly described. The present embodiments are, therefore, to be considered in all respects illustrative and not restrictive.

We claim:

1. A fabric composite strain sensor for measuring in-plane unidirectional strain comprising:
   an elastic fabric substrate, itself comprising a plurality of individual fibers integrated together;
   a solid composite film comprised of a mixture of electrically conductive particles or fibers and an elastomer matrix, layered onto a single side of said elastic fabric substrate;
   wherein the fabric composite strain sensor is mechanically treated by cycling at high extensions to stabilize it;
   wherein the application of strain on said elastic fabric substrate causes the formation of cracks within said solid composite film;
   wherein the resistance within the fabric composite strain sensor is correlated with the width of said formed cracks; and
   wherein a gauge factor of the sensor is controlled by adjusting any one from the group consisting of: type of knitting structure of the elastic fabric substrate, density of loops in the warp and weft direction of the elastic fabric substrate, yarn linear density of the elastic fabric substrate, concentration of the electrically conductive particles or fibers, thickness of the solid composite film and direction of the sensor.

2. The sensor according to claim 1, wherein the sensor has a maximum measurable strain of 50%, a strain sensitivity (gauge factor) having a range from 2 to 500 and a fatigue life of at least 100,000 cycles.

3. The sensor according to claim 1, wherein the elastic fabric substrate has a woven, knitted or a braid structure.

4. The sensor according to claim 1, wherein the electrically conductive particles is any one from the group consisting of: carbon black, gold particles, silver particles, copper particles, carbon nanotubes, stainless steel fiber, gold fiber, silver fiber, gold fiber, copper fiber, carbon fiber and conductive polymer fiber.

5. The sensor according to claim 1, wherein the elastomer matrix is made from any one from the group consisting of: natural rubber, silicone, polyurethane, polysulfide, polyacrylic, fluorosilicone and any other elastic matrix.

6. A method for manufacturing a fabric composite strain sensor comprising the steps of:
   applying a solid composite film comprising a mixture of electrically conductive particles or fibers and an elastomer matrix, onto a single side of an elastic fabric substrate, which it self comprises a plurality of individual fibers integrated together;
   mechanically treating the combination of the elastic fabric substrate and the layered solid composite film by cycling to high extensions then recovery to stabilize the fabric composite strain sensor;
   wherein the application of strain on said elastic fabric substrate causes the formation of cracks within said composite film;
   wherein the resistance within the fabric composite strain sensor is correlated with the width of said formed cracks; and
   wherein a gauge factor of the sensor is controlled by adjusting any one from the group consisting of: type of knitting structure of the elastic fabric substrate, density of loops in the warp and weft direction of the elastic fabric substrate, yarn linear density, concentration of the electrically conductive particles or fibers, thickness of the solid composite film and direction of the sensor.

7. The method according to claim 6, further comprising:
   cleaning the elastic fabric substrate; and
   drying the elastic fabric substrate.

8. The method according to claim 6, further comprising heating the electrically conductive particles or fibers to remove absorbent present in the electrically conductive particles or fibers.

9. The method according to claim 6, further comprising treating the electrically conductive particles with coupling agents to enhance the adhesion of the electrically conductive particles or fibers to the elastomer matrix.

10. The method according to claim 6, further comprising curing the coated elastic fabric substrate at an elevated temperature.

11. The method according to claim 6, wherein the coated elastic fabric substrate is mechanically treated at a controlled temperature.

12. The method according to claim 6, wherein the fabric strain sensor is used to sense in-plane unidirectional deformation.

13. The method according to claim 6, wherein the volume fraction of the electrically conductive particles of fibers in the mixture is predetermined.

* * * * *